United States Patent
Kim

(10) Patent No.: US 7,642,648 B2
(45) Date of Patent: Jan. 5, 2010

(54) SEMICONDUCTOR DEVICE HAVING A REDUCTANT LAYER AND MANUFACTURING METHOD THEREOF

(75) Inventor: Jung Joo Kim, Seoul (KR)

(73) Assignee: Dongbu Electronics Co. Ltd., Seoul (KR)

( * ) Notice: Subject to any disclaimer, the term of this patent is extended or adjusted under 35 U.S.C. 154(b) by 0 days.

(21) Appl. No.: 12/416,387

(22) Filed: Apr. 1, 2009

(65) Prior Publication Data

US 2009/0189284 A1   Jul. 30, 2009

Related U.S. Application Data

(62) Division of application No. 11/320,625, filed on Dec. 30, 2005, now Pat. No. 7,528,063.

(30) Foreign Application Priority Data

Dec. 31, 2004   (KR) .................. 10-2004-0117694

(51) Int. Cl.
*H01L 23/48* (2006.01)
*H01L 23/52* (2006.01)
*H01L 29/40* (2006.01)

(52) U.S. Cl. .............. 257/751; 257/774; 257/750; 438/622; 438/627

(58) Field of Classification Search ........... 257/774, 257/750, 751, E23.011; 438/622, 627, 628, 438/675
See application file for complete search history.

(56) References Cited

U.S. PATENT DOCUMENTS

| 4,351,695 | A | 9/1982 | Hieber et al. |
| 7,098,134 | B2* | 8/2006 | Kim .................. 438/687 |
| 2002/0102793 | A1 | 8/2002 | Wu |
| 2003/0003745 | A1 | 1/2003 | Wang et al. |
| 2004/0253806 | A1 | 12/2004 | Steinlesberger et al. |
| 2005/0253268 | A1* | 11/2005 | Hsu et al. .............. 257/758 |
| 2005/0277294 | A1 | 12/2005 | Schaeffer et al. |
| 2006/0105558 | A1* | 5/2006 | Chuang et al. ......... 438/597 |

OTHER PUBLICATIONS

Quirk et al., Semiconductor Manufacturing Technology, 2001, Prentice Hall, p. 313.

* cited by examiner

*Primary Examiner*—Phuc T Dang
(74) *Attorney, Agent, or Firm*—Finnegan, Henderson, Farabow, Garrett & Dunner, L.L.P.

(57) ABSTRACT

A semiconductor device includes an inter-metal dielectric (IMD) formed on a substrate and having at least one via hole, a via hole formed by filling the via hole with a first metal, a reductant layer formed on the via plug and the inter-metal dielectric to a predetermined thickness, and a metal line layer formed by depositing a second metal on the reductant layer.

9 Claims, 4 Drawing Sheets

SEMICONDUCTOR DEVICE HAVING A REDUCTANT LAYER AND MANUFACTURING METHOD THEREOF

This application is a divisional application of U.S. patent application Ser. No. 11/320,625 filed on Dec. 30, 2005 now U.S. Pat. No. 7,528,063, which claims the benefit of priority to Korean Patent Application No. 10-2004-0117694 filed in Korea on Dec. 31, 2004.

BACKGROUND OF THE INVENTION

1. Field of the Invention

The present invention relates to a semiconductor device and a manufacturing method thereof, and more particularly, to a method of forming a metal line of a semiconductor device.

2. Description of the Related Art

A related art method of manufacturing a semiconductor device will be described below with reference to FIGS. 1A to 1C.

Referring to FIG. 1A, an oxide is coated on a substrate 12 to form an inter-metal dielectric (IMD) 14. A photoresist pattern (not shown) is formed on the IMD 14 and a predetermined portion of the IMD 14 is etched to form a via hole 16a. A via plug 16 is formed by filling the via hole 16a with tungsten (W) using a chemical vapor deposition (CVD) process. Then, the surface of the via hole 16 is polished using a chemical mechanical polishing (CMP) such that an excessively deposited tungsten is removed.

Referring to FIG. 1B, aluminum (Al) is deposited on the via plug 16 and a metal line pattern 18 is formed, thereby forming a metal line of the semiconductor device.

Referring to FIG. 1C, a metal oxide 19 such as tungsten oxide (WOx) is formed between the via plug 16 and the metal line layer 18. The metal oxide 19 can be easily formed by the reaction of the metal (such as tungsten) existing on the surface of the via plug 16 with oxygen under air exposure after a CMP process of the via plug 16 or between the CMP process and the process of forming the metal line layer 18. Since the metal oxide 19 is formed between the via plug 16 and the metal line layer 18 deposited later, a contact resistance is degraded. Consequently, the reliability of the semiconductor device is degraded.

SUMMARY OF THE INVENTION

Accordingly, the present invention is directed to a semiconductor device and a manufacturing method thereof that substantially obviate one or more problems due to limitations and disadvantages of the related art.

An object of the present invention is to provide a semiconductor device and a manufacturing method thereof, capable of preventing the generation of a metal oxide causing a contact resistance to increase on the surface of a via plug, and improving the reliability of the device.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a semiconductor device including: an inter-metal dielectric (IMD) formed on a substrate, the IMD having at least one via hole; a via hole formed by filling the via hole with a first metal; a reductant layer formed on the via plug and the inter-metal dielectric to a predetermined thickness; and a metal line layer formed by depositing a second metal on the reductant layer.

In another aspect of the present invention, there is provided a method of manufacturing a semiconductor device, including: preparing a substrate where an inter-metal dielectric is formed on the top thereof; etching the inter-metal dielectric to form a via hole exposing a portion of the substrate; forming a via plug by filling the via hole with a first metal; forming a reductant layer by coating a reducing agent on the via plug to a predetermined thickness; and forming a metal line layer by depositing a second metal on the reductant layer and the inter-metal dielectric.

In a further another aspect of the present invention, there is provided a method of manufacturing a semiconductor device, including: preparing a substrate where an inter-metal dielectric is formed on the top thereof; etching the inter-metal dielectric to form a via hole exposing a portion of the substrate; forming a via plug by selectively depositing a first metal into the via hole; forming a reductant layer by coating a reducing agent on the via plug to a predetermined thickness; forming a metal line layer by non-selectively depositing a second metal on the reductant layer and the inter-metal dielectric; and monocrystallizing the first metal and the second metal in a direction identical to a crystallization direction of the substrate by heating the substrate at predetermined pressure and temperature for a predetermined time.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

Hereinafter, a semiconductor device and a manufacturing method thereof will be described in detail with reference to the accompanying drawings.

Embodiment 1

Figure 1A:
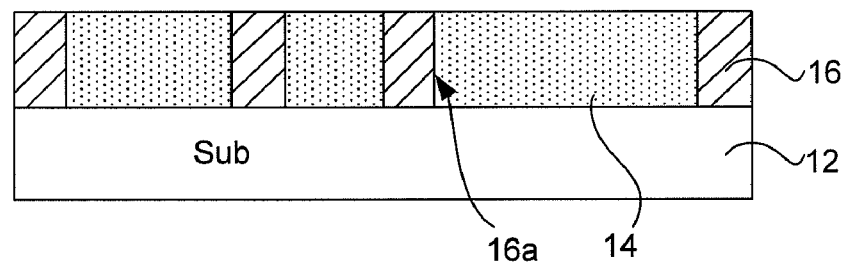
FIG. 1A to 1C are sectional views of a related art semiconductor device.
Figure 1B:
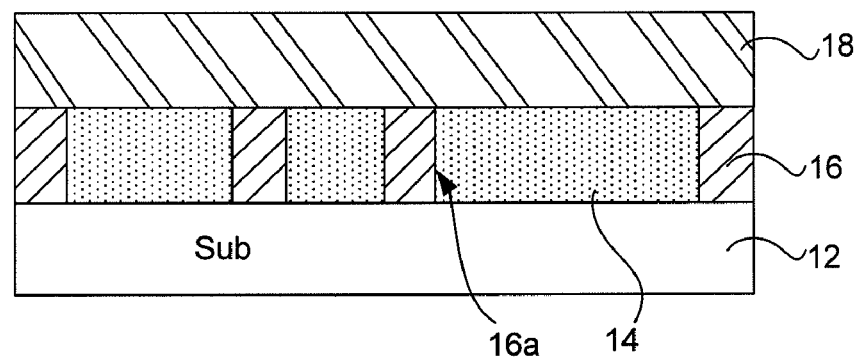
Figure 1C:
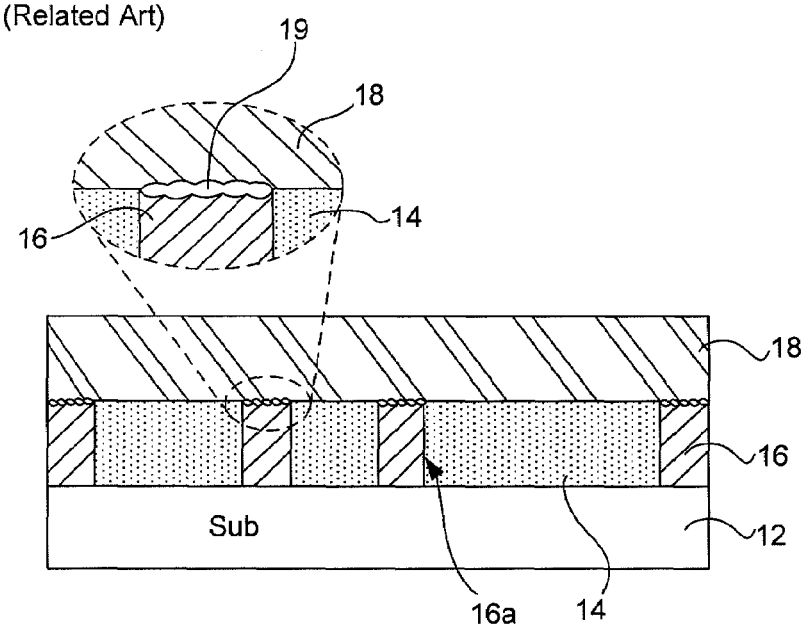
Figure 2:
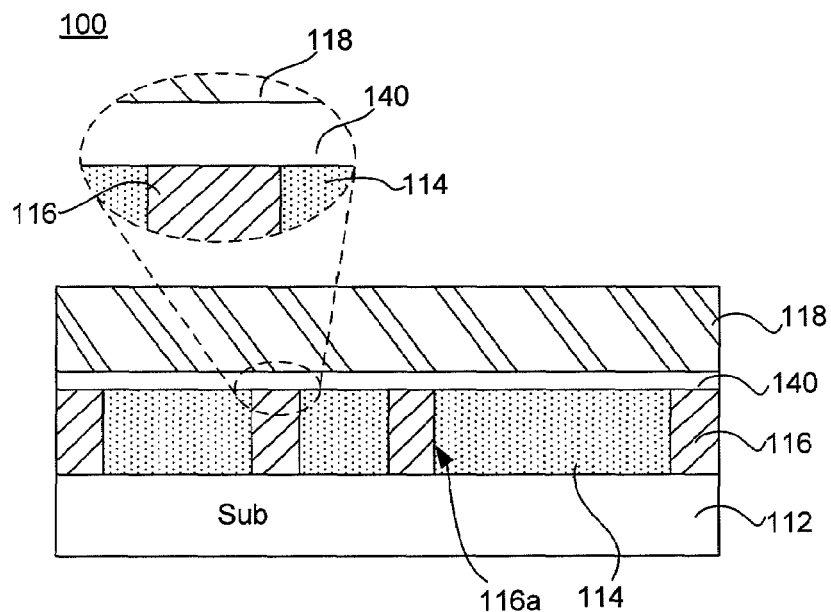
FIG. 2 is a sectional view of a semiconductor device according to a first embodiment of the present invention.

FIG. 2 is a sectional view of a semiconductor device according to a first embodiment of the present invention.

Referring to FIG. 2, the semiconductor device 100 according to the first embodiment of the present invention includes an IMD 114 formed on a substrate 112 and having at least one via hole 116a, a via plug 116 formed by filling the via hole 116a with a first metal, a reductant layer 140 formed on the via plug 116 and the IMD 114 to a predetermined thickness, and a metal line layer 118 formed by depositing a second metal on the reductant layer 140.

In the case of a multiple connection, the IMD 114 serves as an insulation layer between lines formed in lower and upper layers. An IMD formed between a polycrystalline silicon such as a gate electrode and a first metal line is called a polysilicon-metal dielectric (PMD).

Examples of the IMD 114 are a CVD-SiO$_2$ layer doped using a silane gas (SiH$_4$), a CVD-PSG (phospho silicate glass) doped with phosphorus (P), and a BPSG (borophospho silicate glass) using TEOS (tetraethyl orthosilicate). Also, other dielectrics may be used as the IMD 114.

Examples of the PMD as the IMD 114 are a TEOS-CVD, a PECVD (plasma enhanced chemical vapor deposition)-SiO$_2$, a PECVD-SiON, and a BPSG using TEOS. Also, other dielectrics may be used as the PMD.

The via plug 116 may be formed of tungsten, aluminum, or copper. The via plug 116 may also be formed of other metals.

Since tungsten has a high melting point, it can suppress an electron escape phenomenon and can be applied in a high temperature process.

Aluminum has a low resistivity and can be deposited at a low temperature of about 250° C. Also, aluminum has good step coverage.

The reductant layer 140 is a material having a reducing power higher than that of the first metal. For example, the reductant layer 140 may be formed of hafnium (Hf). Also, any material having a reducing power higher than that of the first metal can be used for the reductant layer 140.

In a state in which the reducing power of hafnium (Hf) is higher than the first metal at room temperature, a metal oxide of the first metal is reduced and hafnium is oxidized, resulting in hafnium oxide (HfOx).

After removing the metal oxide 19 acting as a resistance-increasing impurity, the reductant layer 140 deposited with the hafnium or hafnium oxide is formed on an interface between the first metal and the second metal that is deposited later to form a metal line.

Also, the reductant layer 140 reacts with hydroxy radical (—OH), oxygen (O$_2$), and water (H$_2$O) introduced from the outside and thus a metal oxide 19 is not formed any more.

In the metal line layer 118, the second metal may be aluminum (Al) or copper (Cu). The second metal layer may also be formed of other metals.

Aluminum (Al) has a low resistivity and good adhesive force with respect to SiO$_2$ and silicon. Copper (Cu) has a lower resistivity than that of aluminum (Al) and good property in preventing electron escape.

Meanwhile, if the metal line layer 118 formed by mixing aluminum with a small amount of copper (Cu), titanium (Ti) and silicon (Si) is used, electron escape phenomenon of aluminum (Al) can be prevented.

Hereinafter, a method of manufacturing the semiconductor device 100 according to the first embodiment of the present invention will be described with reference to FIG. 2.

The method of manufacturing the semiconductor device according to the first embodiment of the present invention includes preparing a substrate 112 where an IMD 114 is formed on the top thereof, etching the IMD 114 to form a via hole 116a exposing a portion of the substrate 112, forming a via plug 116 by filling the via hole 116a with a first metal, forming a reductant layer 140 by coating a reducing agent on the via plug 116 to a predetermined thickness, and forming a metal line layer 118 by depositing a second metal on the reductant layer 140 and the IMD 114.

First, the process of preparing the substrate 112 where the IMD 114 is formed on the top thereof will be described.

A dielectric is coated on the top of the substrate 112 to form the IMD 114 to a predetermined thickness.

Examples of the IMD 114 are a CVD-SiO$_2$ doped using a silane gas (SiH$_4$), a CVD-PSG (phospho silicate glass) doped with phosphorus (P), and a BPSG (borophospho silicate glass) using TEOS (tetraethyl orthosilicate). Also, other dielectrics may be used as the IMD 114.

Also, examples of the PMD as the IMD 114 are a TEOS-CVD, a PECVD (plasma enhanced chemical vapor deposition)-SiO2, a PECVD-SiON, and a BPSG using TEOS. Also, other dielectrics may be used as the PMD.

Next, the process of forming the via hole 116a will now be described.

A photoresist pattern (not shown) is formed on the IMD 114 and a predetermined portion of the IMD 114 is etched to form the via hole 116a.

The via hole 116a may be formed in a vertical type in which the side of the via hole is formed vertically, or a tapered type in which the side of the via hole is tapered. The vertical type via hole requires a small area and is convenient to perform a dry etching, and can also prevent an over-etching. The tapered type via hole has good step coverage.

Next, the process of forming the via plug 116 will now be described.

The via plug 116 is formed by filling the via hole 116a with a first metal. At this time, the first metal used for filling the via hole 116a may be tungsten (W), aluminum (Al), copper (Cu), and so on.

The via plug 116 can be formed of tungsten (w) using a CVD or sputtering process. If tungsten is deposited using the CVD process, electron escape can be prevented and the step coverage is improved.

Aluminum has a low resistivity and can be deposited at a low temperature of about 250° C. Also, aluminum has a characteristic of good step coverage. If the via plug 116 is formed of aluminum (Al), atom transfer occurs as a whole so that the formation of void is prevented and reliability is improved.

The via hole 116a can be filled with aluminum (Al) using a CVD-Al process, an enhanced sputtering method, and so on. A material of the CVD-Al may be TIBA (triisobutyl-aluminum, Al(C$_4$H$_9$)$_3$). Aluminum is precipitated using a thermal decomposition.

Also, the via hole 116a can be filled with copper (Cu) using a CVD process or a sputtering process. If copper (Cu) is deposited using the CVD process, copper has a low resistivity and can be deposited at a low temperature. Also, copper has a characteristic of good step coverage.

After forming the via plug 116, a planarization process such as a CMP process can be further performed on the surface of the via hole 116 so as to remove an excessively stacked via hole 116.

Next, the process of forming the reductant layer 140 on the via plug 116 will now be described.

The reductant layer 140 is formed to a predetermined thickness by depositing a reducing agent on the via plug 116.

Hafnium (Hf) can be used as the reducing agent. Any metal having a reducing power higher than that of the first metal can be used.

Hafnium (Hf) can be deposited through a physical vapor deposition (PVD) or a CVD process using the existing atomic layer deposition (ALD) apparatus or a PECVD apparatus. Therefore, an additional apparatus is not required.

Next, the process of forming the metal line layer 118 on the reductant layer 140 and the IMD 114 will now be described.

The metal line layer 118 is formed by depositing a second metal on the reductant layer 140 by a CVD or PVD process, thereby forming the metal line of the semiconductor device.

The second metal may be aluminum (Al), copper (Cu), or other metals. Also, if the metal line layer 118 is formed by mixing aluminum (Al) with a small amount of copper (Cu), titanium (Ti), or silicon (Si), electron escape phenomenon of aluminum (Al) can be prevented.

In addition, after forming the metal line layer 118, a thermal treatment can be further performed in an oxygen or nitrogen ambient. Such a thermal treatment can further remove a metal oxide that may still remain.

According to the present invention, after forming the via plug by filling the via hole with the first metal and before forming the metal line layer, the reductant layer such as hafnium (Hf) is deposited on the via plug and the IMD. In this manner, the generation of a metal oxide causing the increase of the contact resistance in the surface of the via plug can be prevented.

Also, since the reductant layer blocks the introduction of oxygen from the outside, the additional generation of a metal oxide can be prevented.

In addition, the reductant layer can be formed using the existing apparatus. That is, the present invention can provide an economical effect that can use the existing apparatus without any additional cost.

Further, since a sputter etch for removing the metal oxide is not performed, the present invention can prevent a barrier damage or a plasma-induced damage (PID) caused by the sputter etch.

Embodiment 2

Figure 3:
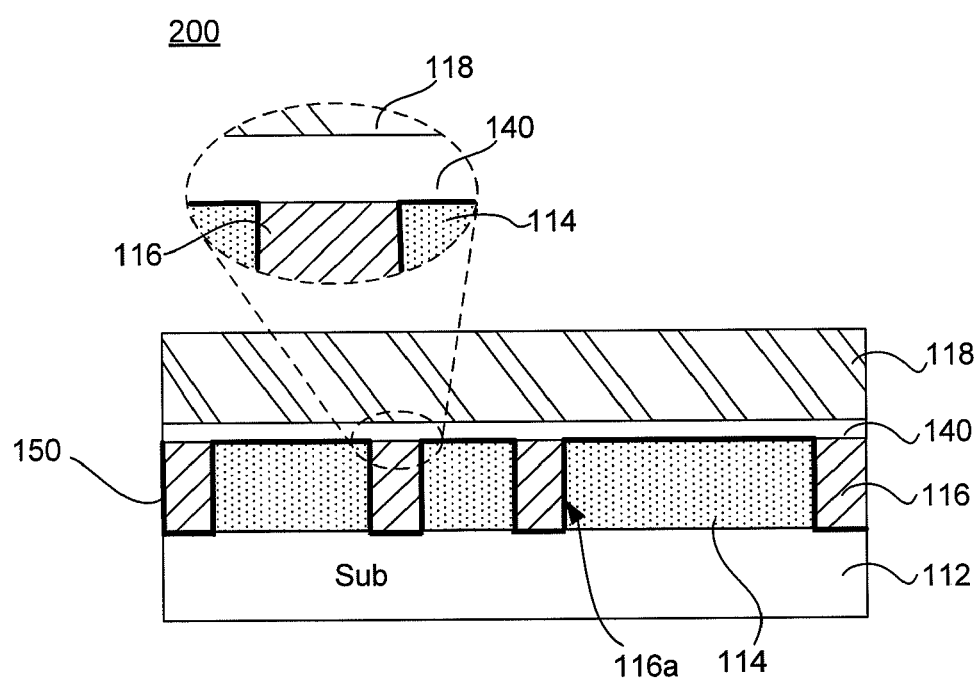
FIG. 3 is a sectional view of a semiconductor device according to a second embodiment of the present invention.

FIG. 3 is a sectional view of a semiconductor device according to a second embodiment of the present invention.

Referring to FIG. 3, the semiconductor device according to the second embodiment of the present invention includes an IMD 114 formed on a substrate 112 and having at least one via hole 116a, a barrier layer 150 formed on the IMD 114 and an exposed portion of the substrate 112, a via plug 116 formed by depositing a first metal on the barrier layer 150 of the via hole 116a, a reductant layer 140 formed on the via plug 116 and the IMD 114 to a predetermined thickness, and a metal line layer 118 formed by depositing a second metal on the reductant layer 140.

Also, the barrier layer 150 may be further formed between the IMD 114 and the reductant layer.

The barrier layer 150 may be a Ti layer, a TiN layer, a Ti/TiN layer, or the like.

The barrier layer 150 may be formed using a CVD process, a sputtering process, and so on.

According to the second embodiment of the present invention, the generation of a metal oxide causing the increase of the contact resistance in the surface of the via plug can be prevented by reductant layer. Also, since the reductant layer blocks the introduction of oxygen from the outside, the additional generation of a metal oxide can be prevented. More-over, the barrier layer has good adhesive force with respect to the IMD, thereby preventing the layers being opened.

Embodiment 3

A semiconductor device according to a third embodiment of the present invention will be described with FIG. 4.

Figure 4:
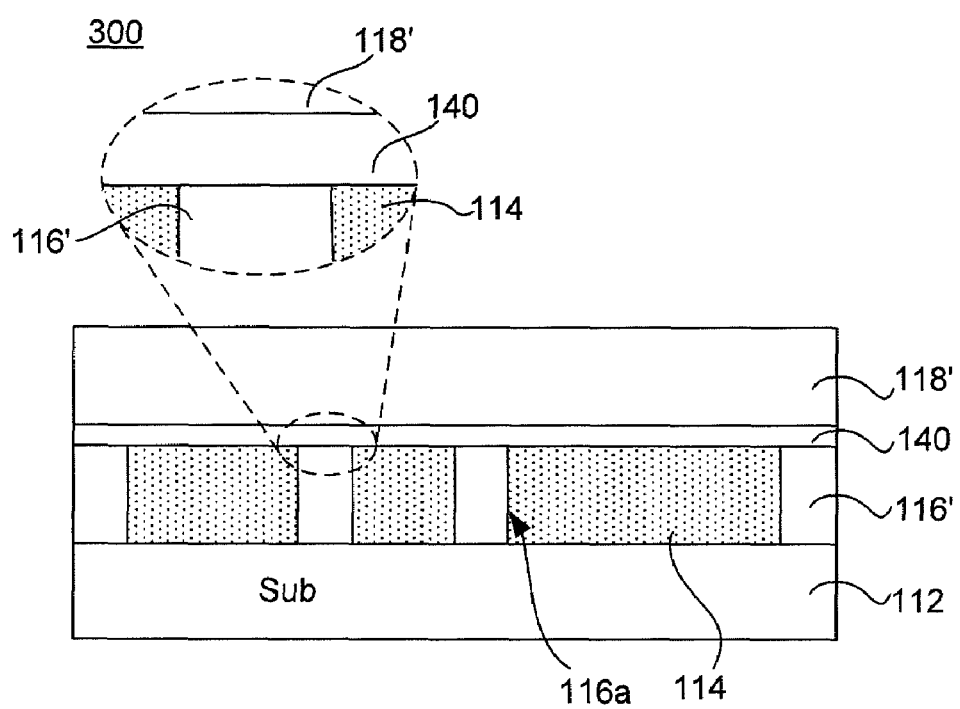
FIG. 4 is a sectional view of a semiconductor device according to a fourth embodiment of the present invention.

Referring to FIG. 4, the semiconductor device according to the third embodiment of the present invention includes an IMD 114 formed on a substrate 112 and having a via hole 116a, a via plug 116' formed by filling the via hole 116a with a first metal, a reductant layer 140 formed on the via plug 116' and the IMD 114, and a metal line layer 118' formed by depositing a second metal on the reductant layer 140. the via plug 116' and the metal line layer 118' are formed of a monocrystalline metal.

A method of manufacturing the semiconductor device according to the third embodiment of the present invention includes preparing a substrate 112 where an IMD 114 is formed on the top thereof, etching the IMD 114 to form a via hole 116a exposing a portion of the substrate 112, forming a via plug 116' by selectively filling the via hole 116a with a first metal, forming a reductant layer 140 by coating a reducing agent on the via plug 116 to a predetermined thickness, forming a metal line layer 118' by non-selectively depositing a second metal on the reductant layer 140 and the IMD 114, and monocrystallizing the via plug 116' and the metal line layer 118' in a direction identical to that of the substrate 112. by heating the substrate 112 at predetermined pressure and temperature for a predetermined time.

In this embodiment, the method may further include a process of forming a barrier layer (not shown) on the IMD 14 and the exposed portion of the substrate 112 after forming the via hole 116a.

Generally, loss of the metal line often occurs in grain boundary. Therefore, if the polycrystalline via hole or metal line is monocrystallized, self diffusion activation energy of metal increases to thereby improve electron escape phenomenon.

In this embodiment, Al $(CH_3)_2$AlH (dimethylalumimum hybride) is selectively deposited into the via hole 116a using an LPCVD process in a $H_2$ ambient. After depositing the reductant layer 140, the metal line layer 118' is non-selectively deposited on the reductant layer 140. Then, aluminum (Al) of the via plug 116' is rearranged in a direction identical to the crystallization direction of the silicon substrate 112 by heating the resulting structure at the pressure of less than $5\times10^{-6}$ Pa and the temperature of 500-700° C. for about 10-30 minutes. Also, aluminum (Al) of the metal line layer 118' deposited above the via hole 116a is changed into a monocrystal having the same crystallization direction as that of the silicon substrate 112. Various methods can be used for making the via plug 116'a and the metal line layer 118' having the same crystallization direction as that of the substrate 112.

According to the third embodiment of the present invention, the generation of a metal oxide causing the increase of the contact resistance in the surface of the via plug can be prevented by depositing the reductant layer. Also, since the reductant layer blocks the introduction of oxygen from the outside, the additional generation of a metal oxide can be prevented. Moreover, the grain boundary is reduced due to the monocrystallization of the metal line layer, thereby greatly improving electron escape phenomenon.

It will be apparent to those skilled in the art that various modifications and variations can be made in the present invention. Thus, it is intended that the present invention covers the modifications and variations of this invention provided they come within the scope of the appended claims and their equivalent.

What is claimed is:

1. A semiconductor device comprising:
    an inter-metal dielectric (IMD) formed on a substrate, the IMD having at least one via hole;
    a via plug formed by filling the via hole with a first metal;
    a reductant layer formed on the via plug and the inter-metal dielectric to a predetermined thickness; and
    a metal line layer formed by depositing a second metal on the reductant layer, wherein the reductant layer comprises a layer of hafnium (Hf).

2. The semiconductor device according to claim 1, further comprising a barrier layer formed between the inter-metal dielectric and the via hole.

3. The semiconductor device according to claim 1, wherein the reductant layer has a reducing power higher than that of the first metal.

4. The semiconductor device according to claim 1, wherein the first metal comprises tungsten (W).

5. The semiconductor device according to claim 1, wherein the first metal comprises copper (Cu).

6. The semiconductor device according to claim 1, wherein the second metal comprises aluminum (Al).

7. The semiconductor device according to claim 1, wherein the second metal comprises copper (Cu).

8. The semiconductor device according to claim 1, wherein the via plug and the metal line layer are formed of monocrystalline metal.

9. The semiconductor device according to claim 1, wherein the via hole comprises a vertical-type via hole.

* * * * *